United States Patent [19]

Lesser

[11] 4,044,270

[45] Aug. 23, 1977

[54] DYNAMIC LOGIC GATE

[75] Inventor: Mark B. Lesser, Laguna Niguel, Calif.

[73] Assignee: Rockwell International Corporation, El Segundo, Calif.

[21] Appl. No.: 698,237

[22] Filed: June 21, 1976

[51] Int. Cl.² .................. H03K 19/08; H03K 19/20; H03K 19/40
[52] U.S. Cl. ............................ 307/205; 307/207; 307/208; 307/214
[58] Field of Search ............... 307/205, 208, 214, 215, 307/207, 221 R, 221 C, 269, 270

[56] References Cited

U.S. PATENT DOCUMENTS

| | | | |
|---|---|---|---|
| 3,551,692 | 12/1970 | Yen | 307/208 X |
| 3,601,627 | 8/1971 | Booher | 307/208 X |
| 3,612,900 | 10/1971 | Davies | 307/221 C |
| 3,638,036 | 1/1972 | Zimbelmann | 307/208 X |
| 3,678,476 | 7/1972 | Ebertin | 307/205 X |
| 3,747,062 | 7/1973 | Thompson | 307/205 |
| 3,944,848 | 3/1976 | Deeren | 307/205 |

Primary Examiner—Stanley D. Miller, Jr.
Assistant Examiner—Larry N. Anagnos
Attorney, Agent, or Firm—H. Frederick Hamann; G. Donald Weber, Jr.; Morland Charles Fischer

[57] ABSTRACT

An improved dynamic logic gate compatible with a four-phase, major-minor clocking scheme and a six-phase metal oxide semiconductor (MOS) system. The gate evaluates only during an in-between clock phase, which phase corresponds to the interval of time between the occurrence of first and second major clock phases.

12 Claims, 4 Drawing Figures 4,044,270

DYNAMIC LOGIC GATE

BACKGROUND OF THE INVENTION

1. Field of the Invention

This invention relates to an integrated circuit logic gate compatible with a four-phase, major-minor clocking arrangement and a six-phase metal oxide semiconductor (MOS) system.

2. Prior Art

Integrated circuit field effect transistor (FET) logic circuits, which are strobed by a four-phase, major-minor clocking scheme, can be arranged to form six basic logic gates. Reference may be made to U.S. Ser. No. 659,057, filed Feb. 18, 1976, for a brief description of these aforementioned six basic logic gates.

A first logic gate, commonly designated as a type 2 logic gate (which precharges when multi-phase clock signal $\phi_1$ comes true and discharges or evaluates when multiphase clock signal $\phi_2$ comes true) and a second logic gate, commonly designated as a type 4 logic gate (which precharges during $\phi_3$ and evaluates during $\phi_4$) are referred to as major gates by those skilled in the art, inasmuch as each gate evaluates during major clock phases $\phi_2$ and $\phi_4$, respectively. For a more detailed description of the major logic gate types 2 and 4, reference may be made to U.S. Pat. No. 3,601,627 issued Aug. 24, 1971. However, none of the six basic logic gates is implemented so that both of the major gate types, 2 and 4, can be directly fanned-in without the addition of space consuming interface gates, such as inverters and the like. This is because no single logic gate is known which is adapted to accept information signals when the output of both type 2 and 4 logic gates are good (i.e. the output terminals are isolated from the output terminals thereof).

One example of a MOSFET dynamic logic system including six clock phase inputs is U.S. Pat. No. 3,747,064 issued July 17, 1973.

SUMMARY OF THE INVENTION

An improved compact, dynamic logic gate is disclosed which is compatible with a six-phase MOS system and a four-phase, major-minor clocking scheme. In a preferred embodiment, the logic gate precharges during a first recurring major clock time interval, evaluates or discharges during a first in-between time interval (i.e. the clock phase after the completion of the first major time interval and before the occurrence of a second recurring major clock time interval), and isolates the logic gate output node from the input node during both the second major clock time interval and a second in-between clock interval (i.e. the clock phase between the second and first recurring major time intervals). As a result, at least four conventional logic gates, including each of the major logic gate types, designated 2 and 4, can fan directly into the logic gate of the instant invention without the requirement of complex interfacing gates, such as inverters and the like. Moreover, the improved logic gate is ratioless and consumes no d.c. power.

DESCRIPTION OF THE PREFERRED EMBODIMENT

Figure 1:
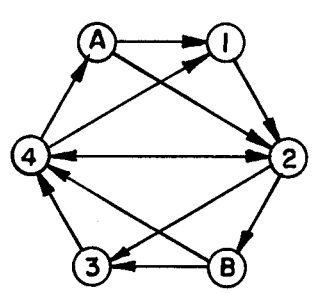
FIG. 1 is a diagram representative of the fan-in and fan-out characteristics of the six conventional logic gates of a four-phase major-minor clocking scheme.

FIG. 1 illustrates the fan-in and fan-out characteristics of the six conventional logic gates of a four phase, major-minor clocking scheme having in-between phases to separate the major clock intervals. The number of each gate indicates in which phase of the present four-phase clocking scheme the particular gate discharges or evaluates. The arrows indicate the possible fan-out of each gate. Gate types denoted as 2 and 4 are referred to as major logic gates. As will be known to those skilled in the art, and as indicated by FIG. 1, logic gates types 2 and 4 evaluate during the $\phi_2$ and $\phi_4$ major clock phases, respectively. Moreover, the output of both the type 2 and 4 major logic gates are good (i.e. isolated from the input) during each of the inbetween clock phases, to be discussed in more detail hereinafter.

Figure 2:
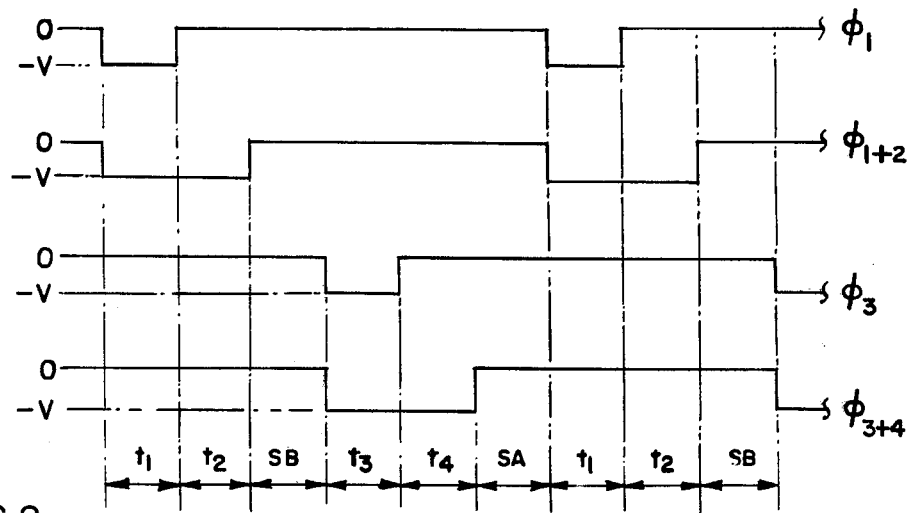
FIG. 2 illustrates the waveforms of a four-phase, major-minor clocking scheme utilized to drive the instant logic gate.

FIG. 2 is illustrative of a well-known four-phase, major-minor clocking scheme which is utilized to strobe the improved logic gate of the instant invention. The waveform of each multi-phase clock signal, $\phi_1$, $\phi_{1+2}$, $\phi_3$, and $\phi_{3+4}$ has relatively HI (i.e. true) and LOW (i.e. false) signal levels, corresponding, for example, to $-V$ volts and ground, respectively. $\phi_{1+2}$ and $\phi_{3+4}$ are designated as major clock phases. The intervals occurring between the major clock phases are designated as in-between clock phases.

Figure 3:
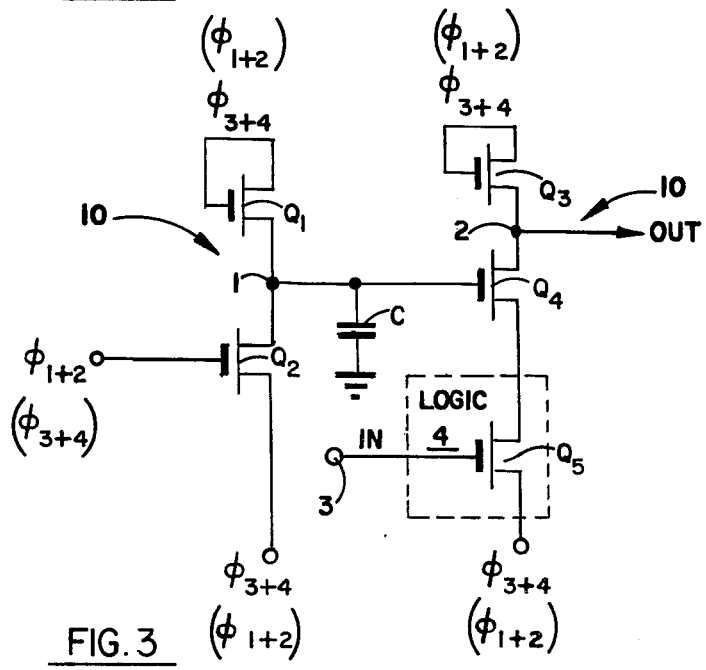
FIG. 3 shows a circuit for implementing the improved logic gate of the instant invention.

FIG. 3 illustrates an integrated circuit for implementing, in a first preferred embodiment, the improved, in-between phase logic gate 10 of the instant invention. The circuit includes metal oxide semiconductor field effect transistors (MOSFETs) $Q_1$, $Q_2$, $Q_3$ and $Q_4$. One conduction path electrode and the control (i.e. gate) electrode of FET $Q_1$ are connected together and to a suitable multi-phase clock signal generator (not shown) to receive a supply of multi-phase clock signals, $\phi_{3+4}$ (the waveform of which is illustrated in FIG. 2). The second conduction path electrode of FET $Q_1$ is connected to a first conduction path electrode of FET $Q_2$. The gate electrode of FET $Q_2$ is connected to the clock signal generator to receive a supply of multiphase clock signals $\phi_{1+2}$ (the waveform of which is also illustrated in FIG. 2). The second conduction path electrode of FET $Q_2$ is connected to the clock signal generator to receive the clock signal designated $\phi_{3+4}$. Thus, the conduction paths of FETs $Q_1$ and $Q_2$ are electrically connected together in series.

One conduction path electrode and the gate electrode of FET $Q_3$ are connected together and to the multi-phase clock signal generator to receive the clock signal $\phi_{3+4}$. The second conduction path electrode of FET $Q_3$ is connected to a first conduction path electrode of isolation FET $Q_4$. The gate electrode of isolation FET $Q_4$ is connected to a common electrical junction 1 with one plate of a capacitor C, between the conduction paths of FETs $Q_1$ and $Q_2$. The second plate of capacitor C is connected to a source of reference potential, such as ground. The output of the instant logic gate, designated node 2, is taken between the conduction path of FETs $Q_3$ and $Q_4$. The second conduction path electrode of isolation FET $Q_4$ is connected to a suitable logic network 4. By way of example, logic network 4 conveniently includes a FET $Q_5$. One conduction path electrode of FET $Q_5$ is connected to the second conduction path electrode of FET $Q_4$. The second conduction path electrode of FET $Q_5$ is connected to the multiphase clock generator to receive the multi-phase clock signal, designated $\phi_{3+4}$. Thus, the conduction paths of FETs $Q_3$–$Q_5$ are electrically connected together in series. The input of the instant logic gate, designated node 3, is connected to the gate electrode of FET $Q_5$.

The operation of the instant logic gate 10 can be described by concurrently referring to FIGS. 2 and 3. Logic gate 10 precharges during the intervals of time designated $t_3$ and $t_4$. As shown in FIG. 2, during the precharge time intervals, a relatively HI level clock signal, $\phi_{3+4}$, $(-V)$ is applied to each of the gate electrodes of FETs $Q_1$ and $Q_3$. Hence, each of these devices is rendered conductive. The relatively HI level clock signal is applied to one plate of capacitor C and to the gate electrode of FET $Q_4$ via the conduction path of FET $Q_1$, whereupon capacitor C is precharged and FET $Q_4$ is rendered conductive. The I level clock signal is also applied to output node 2 via the conduction path of FET $Q_3$, and output node 2 is precharged. Output node 2 and capacitor C are each precharged to a voltage level $-V$ minus a threshold level drop in voltage, $V_t$, caused by the respective impedances of FETs $Q_1$ and $Q_3$. A relatively LOW level clock signal, $\phi_{1+2}$, (ground) is applied to the gate electrode of FET $Q_2$, whereupon FET $Q_2$ is rendered non-conductive during the precharge intervals of time.

The instant circuit evaluates during the SA in-between clock time interval. The SA in-between phase occurs between the $t_4$ and $t_1$ major time intervals when each of the multi-phase clock signal levels is relatively LOW (ground). During the SA in-between time interval, relatively LOW level clock signals are applied to the gate electrodes of each of FETs $Q_1$, $Q_2$, and $Q_3$, whereupon each of these aforementioned devices is rendered non-conductive. FET $Q_4$ remains conductive during the SA in-between time interval, inasmuch as the gate electrode thereof is connected to capacitor C, and capacitor C is precharged during the preceding $t_3$ and $t_4$ precharge time intervals. As a result, gate 10 evaluates as a function of the level of the information signal applied to input node 3 of logic network 4. In a first example, if the information signal applied to input node 3 (and, thus, to the gate electrode of FET $Q_5$) is relatively LOW, FET $Q_5$ is rendered non-conductive. Hence, output node 2, which is precharged during the $t_3$ and $t_4$ clock time intervals, remains charged at a relatively HI level $(V - V_t)$. In a second example, if the information signal applied to input node 3 is relatively HI, FET $Q_5$ is rendered conductive during the SA in-between time interval. Thus, output node 2 is clamped to ground through the series connected conduction paths of FETs $Q_4$ and $Q_5$. It can be seen that, in the present embodiment, logic network 4 causes the instant logic gate 10 to function as an inverter with respect to the logic level of the signals at input node 3 and output node 2.

During the next time intervals, designated $t_1$ and $t_2$, a relatively HI level clock signal, $\phi_{1+2}$, is applied to the gate electrode of FET $Q_2$, whereupon FET $Q_2$ is rendered conductive. Also during the $t_1$ and $t_2$ time intervals, a relatively LOW level clock signal, $\phi_{3+4}$, is applied to each of the gate electrodes of FETs $Q_1$ and $Q_3$, whereupon FETs $Q_1$ and $Q_3$ are rendered non-conductive. During the $t_1$ and $t_2$ time intervals, capacitor C is discharged (i.e. clamped) to ground through common electrical junction 1 and the conduction path of FET $Q_2$. As a result, the gate electrode of isolation FET $Q_4$, is also clamped to ground, and FET $Q_4$ is rendered non-conductive. Thus, during the $t_1$ and $t_2$ time intervals, input node 3 is isolated from output node 2 (by FET $Q_4$), and the level of the information signal applied to input node 3 of logic network 4 is inconsequential to the operation of gate 10.

During the following clock time interval, which occurs between the $t_2$ and $t_3$ major time intervals and is designated in-between phase SB, a relatively LOW level clock signal (i.e. ground) is applied to each of the gate electrodes of FETs $Q_1$, $Q_2$, and $Q_3$. As a result, FETs $Q_1$, $Q_2$ and $Q_3$ are rendered non-conductive. Isolation FET $Q_4$ remains non-conductive, inasmuch as capacitor C is discharged during the preceding $t_1$ and $t_2$ time intervals. Hence, during the SB time interval, output node 2 remains isolated from input node 3, and the level of the information signal applied to input node 3 of logic network 4 remains inconsequential to the operation of gate 10.

In succeeding clock cycles, the improved logic gate 10 precharges, evaluates, and provides isolation, as described above. As will be understood by those skilled in the art, and in a second preferred embodiment, if the $\phi_{3+4}$ and $\phi_{1+2}$ clock signals are interchanged (i.e. clock signal $\phi_{3+4}$ is applied to the gate electrode of FET $Q_2$, and clock signal $\phi_{1+2}$ is applied to the gate and first conduction path electrodes of FETs $Q_1$ and $Q_3$ and to the second conduction path electrodes of FETs $Q_2$ and $Q_5$) another improved in-between phase logic gate is produced. However, this second in-between phase logic gate precharges during time intervals $t_1$ and $t_2$, evaluates during in-between time interval SB, and isolates the output node from the input node during time intervals $t_3$, $t_4$, and SA.

Therefore, a unique in-between phase, dynamic logic gate is disclosed which precharges during a first major clock time interval ($t_3$ and $t_4$ or $t_1$ and $t_2$), evaluates only during the in-between clock interval (SA or SB) before the next (i.e. second) major clock time interval, and isolates the output node from the input node during both the second major clock time interval ($t_1$ and $t_2$ or $t_3$ and $t_4$) and the second in-between clock interval (SB or SA). Moreover, the improved logic gate of the instant invention is ratioless and uses no direct current power. The instant logic gate is also compatible with a six-phase MOS system, but utilizes a minimum number of components.

Figure 4:
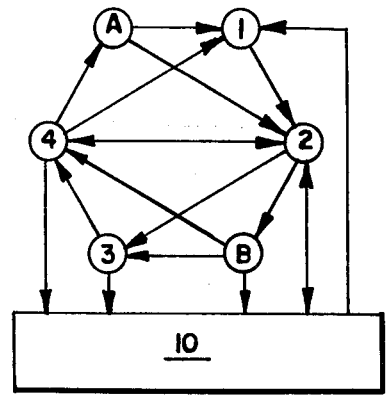
FIG. 4 is a diagram representative of the fan-in and fan-out characteristics of the six gates of FIG. 1 and the improved logic gate of the instant invention.

What is more, the improved logic gate can accept either of the major logic gates (i.e. types 2 and 4) as direct inputs without the requirement of complex interface gates (e.g. inverters and the like). As disclosed above, the improved logic gate 10, in the first and second preferred embodiments, evaluates only during the SA or SB in-between clock time intervals, respectively. Since the outputs of both of the major logic gate types 2 and 4 are good (i.e. isolated) during each of the SA and SB in-between phase time intervals, logic gates 2 and 4 may fan directly into improved logic gate 10, as represented diagrammatically in FIG. 4.

It will be apparent that while a preferred embodiment of the invention as shown and described, various modifications and changes may be made without departing from the true spirit and scope of the invention. For example, FETs $Q_1 - Q_5$ of FIG. 3 are p-channel transistor devices. However, it is to be understood that these or any other suitable multi-terminal semiconductor device may be employed. Thus, the HI and LOW signal levels of the multi-phase clock signals illustrated in FIG. 2 are chosen to be compatible with the type of multi-terminal semiconductor devices utilized. Moreover, the logic network 4 of logic gate 10 is chosen for exemplary purposes only. It is to be understood that logic network 4 may be comprised of any suitable number of multi-terminal semiconductor devices or the like and the corresponding interconnections therebetween.

Having thus set forth a preferred embodiment of the instant invention, what is claimed is:

1. A logic gate driven by a clock signal source means, said source means providing first and second recurring clock signals having opposite reference levels relative to one another during first and second time intervals and the same reference level during an in-between time interval occurring between said first and second time intervals, said logic gate including:
   an input terminal;
   an output terminal;
   a plurality of mulit-terminal semiconductor devices;
   a first of said plurality of semiconductor devices connected between said signal source means to receive said first clock signal and said output terminal to charge said output terminal during the first of said time intervals;
   a second of said semiconductor devices selectively connected between said output terminal and said signal source means to receive said first clock signal and responsive to an information signal applied to said input terminal to conditionally discharge said output terminal during the in-between time interval;
   a third of said semiconductor devices selectively connected between said output terminal and said second semiconductor device and responsive to said second clock signal so as to electrically isolate said output terminal from said input terminal during the second of said time intervals and
   a fourth of said plurality of multi-terminal semiconductor devices connected between said signal source means to receive said first clock signal and a control electrode of said third semiconductor device so as to enable said third semiconductor device during the first of said time intervals.

2. The logic gate recited in claim 1, wherein said first and second clock signals are multi-phase clock signals,
   said first clock signal having a first reference level during said first time interval,
   said second clock signal having said first reference level during said second time interval, and
   each of said first and second clock signal having a second reference level during said in-between time interval.

3. The logic gate recited in claim 1, wherein the conduction paths of the first, second and third of said semiconductor devices are electrically connected in series.

4. The logic gate recited in claim 1, including a fifth of said plurality of multi-terminal semiconductor devices having a control electrode connected to receive said second clock signal and having a conduction path selectively connected between the control electrode of said third semiconductor device and said clock signal source means to receive said first clock signal so as to disable said third semiconductor device during the second of said time intervals to thereby electrically isolate said output terminal from said input terminal.

5. The logic gate recited in claim 4, wherein the conduction paths of the fourth and fifth of said semiconductor devices are electrically connected in series.

6. Th logic gate recited in claim 1, wherein each of said plurality of multi-terminal semiconductor devices is a field effect transistor.

7. A ratioless logic circuit including clock terminal means to receive first and second clock signals having multiple-phase intervals, said first clock signal occurring during first and second phase intervals, said second clock signal occurring during fourth and fifth phase intervals and an in-between phase signal occurring during third and sixth phase intervals and between the occurance of said first and second clock signals, said logic circuit comprising:
   an input data terminal;
   an output data terminal;
   means responsive to said first clock signal to charge said output data terminal to a first reference level during the first and second phase intervals;
   means connected to said input data terminal and adapted to conditionally discharge said output data terminal to a second reference level during the in-between third phase internal; and
   means responsive to said second clock signal to electrically isolate said output data terminal from said input data terminal during the fourth, fifth and in-between sixth phase intervals.

8. The logic circuit recited in claim 7, wherein the means to charge said output data terminal includes a field effect transistor having a conduction path connected between said clock terminal means to receive said first clock signal and said output data terminal to supply said first reference level to said output data terminal during the occurrence of said first and second phase intervals.

9. The logic circuit recited in claim 7, wherein the means to isolate said output data terminal includes first and second field effect transistors;
   said first field effect transistor having a conduction path electrode connected to said output data terminal and a control electrode connected to a first conduction path electrode of said second field effect transistor; and
   said second field effect transistor having a second conduction path electrode connected to said clock terminal means to receive said first clock signal and a control electrode connected to said clock terminal means to receive said second clock signal in order to thereby enable said second transistor and disable said first transistor during the fourth, fifth and in-between sixth phase intervals.

10. The logic circuit recited in claim 7, wherein the means to conditionally discharge said output data terminal includes at least one field effect transistor having a conduction path selectively connected between said output data terminal and said clock terminal means to receive said first clock signal and a control electrode responsive to data signals at said input data terminal for enabling said at least one transistor and for supplying said second reference potential to said output data terminal during the in-between third phase interval.

11. In combination,
   first and second transistors having respective conduction paths electrically connected in series;

third and fourth transistors having respective conduction paths electrically connected in series;
logic means connected to the series connection of said third and fourth transistors;
a control electrode of said fourth transistor connected to an electrical junction formed between the series connected conduction paths of said first and second transistors; and
clock terminal means connected to supply a first clock signal to each of the respective conduction paths of said first, second and third transistors and to said logic means in order to charge said electrical junction, said clock terminal means connected to supply a second clock signal to a control electrode of said second transistor in order to enable said second transistor and thereby discharge said electrical junction.

12. The combination recited in claim 11, wherein said first and second clock signals comprise a four-phase clock signal.

* * * * *